(12) United States Patent
Yoon et al.

(10) Patent No.: US 11,839,114 B2
(45) Date of Patent: Dec. 5, 2023

(54) ORGANIC LIGHT EMITTING DISPLAY DEVICE INCLUDING REFLECTION ELECTRODE AND FIRST ELECTRODE WITH DIELECTRIC LAYER THEREBETWEEN

(71) Applicant: LG Display Co., Ltd., Seoul (KR)

(72) Inventors: Doo-Hyun Yoon, Paju-si (KR); Hyoung-Su Kim, Paju-si (KR); Hye-Seon Eom, Paju-si (KR); Jong-Hyeok Im, Paju-si (KR); Gyung-Min Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 70 days.

(21) Appl. No.: 17/066,353

(22) Filed: Oct. 8, 2020

(65) Prior Publication Data

US 2021/0111236 A1 Apr. 15, 2021

(30) Foreign Application Priority Data

Oct. 10, 2019 (KR) ........................ 10-2019-0125158

(51) Int. Cl.
*H01L 27/32* (2006.01)
*H10K 59/121* (2023.01)
*H10K 50/813* (2023.01)
*H10K 50/818* (2023.01)
*H10K 50/852* (2023.01)
(Continued)

(52) U.S. Cl.
CPC ....... *H10K 59/1216* (2023.02); *H10K 50/813* (2023.02); *H10K 50/818* (2023.02); *H10K 50/852* (2023.02); *H10K 50/865* (2023.02); *H10K 59/122* (2023.02); *H10K 59/38* (2023.02); *H10K 2102/3026* (2023.02)

(58) Field of Classification Search
CPC ............... H01L 27/3265; H01L 27/322; H01L 27/3246; H01L 51/5209; H01L 51/5218; H01L 51/5265; H01L 2251/5315
USPC .......................................................... 257/40
See application file for complete search history.

(56) References Cited

U.S. PATENT DOCUMENTS

2008/0238295 A1 10/2008 Takei et al.
2011/0101386 A1 5/2011 Fukuda
(Continued)

FOREIGN PATENT DOCUMENTS

JP 2012248517 A 12/2012
KR 20130017342 A 2/2013
KR 101801349 B1 11/2017

*Primary Examiner* — Xia L Cross
(74) *Attorney, Agent, or Firm* — SEED INTELLECTUAL PROPERTY LAW GROUP LLP

(57) ABSTRACT

The present disclosure discloses an organic light emitting display device. The organic light emitting display device includes a substrate, a driving transistor, a reflection electrode, a dielectric layer, a first and second electrode, and an organic light emitting layer. The driving transistor is in each of a plurality of pixel regions which are defined on the substrate. The reflection electrode is on the driving transistor, and is electrically connected to a gate electrode of the driving transistor. The dielectric layer is on the reflection electrode. The first electrode is on the dielectric layer, and is electrically connected to a source electrode of the driving transistor, and faces the reflection electrode. The organic light emitting layer is on the first electrode. The second electrode is on the organic light emitting layer.

16 Claims, 5 Drawing Sheets

(51) Int. Cl.
  *H10K 50/86* (2023.01)
  *H10K 59/38* (2023.01)
  *H10K 59/122* (2023.01)
  *H10K 102/00* (2023.01)

(56) References Cited

U.S. PATENT DOCUMENTS

| | | | |
|---|---|---|---|
| 2013/0009162 A1* | 1/2013 | Kang | H10K 50/8426 257/E51.005 |
| 2014/0231778 A1* | 8/2014 | Koshihara | H10K 50/852 257/40 |
| 2015/0090992 A1* | 4/2015 | Miyazawa | H10K 50/856 257/40 |
| 2017/0084676 A1* | 3/2017 | Jang | H01L 27/326 |
| 2017/0125489 A1* | 5/2017 | Jang | H01L 51/56 |
| 2017/0155094 A1* | 6/2017 | Joung | H10K 59/124 |
| 2020/0135829 A1* | 4/2020 | Kim | G09G 3/2003 |

\* cited by examiner

ORGANIC LIGHT EMITTING DISPLAY DEVICE INCLUDING REFLECTION ELECTRODE AND FIRST ELECTRODE WITH DIELECTRIC LAYER THEREBETWEEN

CROSS-REFERENCE TO RELATED APPLICATION(S)

The present application claims the priority benefit of Korean Patent Application No. 10-2019-0125158 filed in Republic of Korea on Oct. 10, 2019, which is hereby incorporated by reference in its entirety for all purposes as if fully set forth herein.

BACKGROUND

Technical Field

The present disclosure relates to an organic light emitting display device (OLED).

Description of the Related Art

Recently, flat display devices having excellent properties of thin profile, light weight, low power consumption and the like have been developed widely and applied to various fields.

Among the flat display devices, an organic light emitting display device (OLED) may be referred to as an organic electroluminescent display device and is a device in which charges are injected into an emitting layer formed between a cathode, which is an electron-injecting electrode, and an anode, which is a hole-injecting electrode, to form an electron-hole pair, and a light is emitted when the electron-hole pair disappears.

As a resolution of the organic light emitting display device increases, it is difficult for to secure a capacitance of a storage capacitor. Thus, it is required to improve a storage capacitance.

BRIEF SUMMARY

Accordingly, the present disclosure is directed to an organic light emitting display device (OLED) that substantially obviates one or more of the problems due to limitations and disadvantages of the related art.

The technical benefits of the present disclosure includes to provide an OLED that can improve a storage capacitance thereof.

Additional features and benefits of the disclosure will be set forth in the description which follows, and in part will be apparent from the description, or may be learned by practice of the disclosure. The advantages of the disclosure will be realized and attained by the structure particularly pointed out in the written description and claims as well as the appended drawings.

To achieve these and other benefits, and in accordance with one or more embodiments of the present disclosure, as embodied and broadly described herein, an organic light emitting display device includes: a driving transistor in each of a plurality of pixel regions which are defined on a substrate; a reflection electrode which is on the driving transistor, and is electrically connected to a gate electrode of the driving transistor; a dielectric layer on the reflection electrode; a first electrode which is on the dielectric layer, is electrically connected to a source electrode of the driving transistor, and faces the reflection electrode; an organic light emitting layer on the first electrode; and a second electrode on the organic light emitting layer.

It is to be understood that both the foregoing general description and the following detailed description are explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to embodiments, examples of which are illustrated in the accompanying drawings. The same or like reference numbers may be used throughout the drawings to refer to the same or like parts.

First Embodiment

Figure 1:
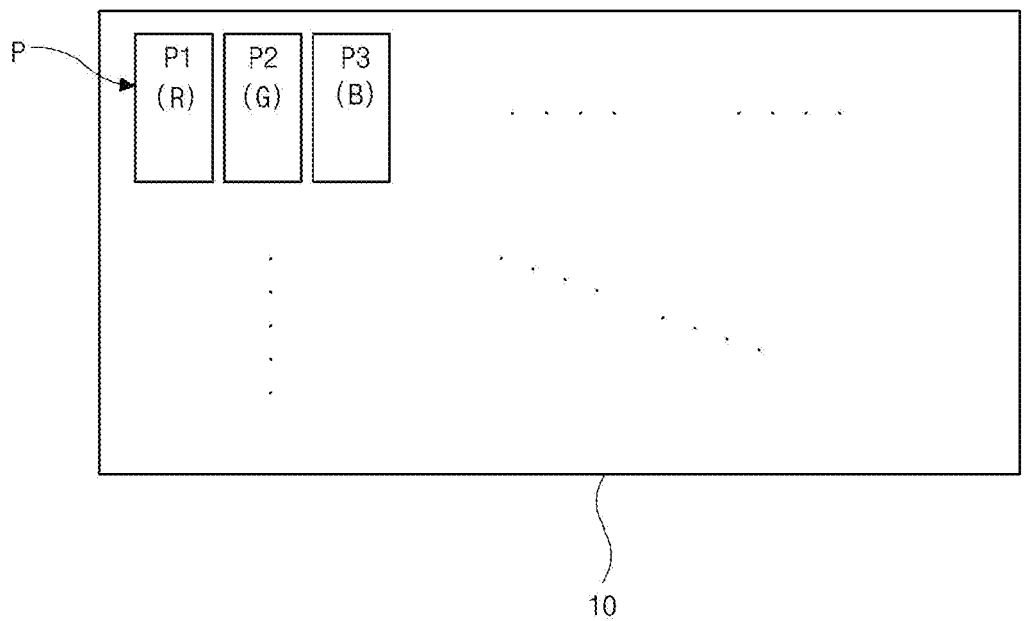
FIG. 1 is a plan view schematically illustrating an OLED according to a first embodiment of the present disclosure.
Figure 2:
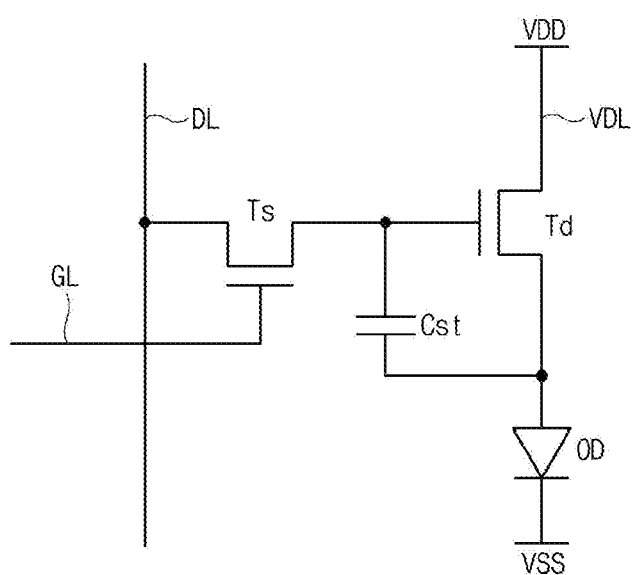
FIG. 2 is a circuit diagram of an example of a pixel region according to a first embodiment of the present disclosure.

FIG. 1 is a plan view schematically illustrating an OLED according to a first embodiment of the present disclosure. FIG. 2 is a circuit diagram of an example of a pixel region according to a first embodiment of the present disclosure.

Referring to FIGS. 1 and 2, in the OLED 10 of the present disclosure, a plurality of pixel regions P may be arranged in a matrix form in a display region to display an image.

The plurality of pixel regions P may include pixel regions constituting a unit pixel and displaying first, second, and third colors as different colors, for example, R, G, and B pixel regions P1, P2, and P3 respectively displaying red, green and blue. For the purpose of explanations, the R, G, and B pixel regions P1, P2, and P3 may be respectively referred to as first, second, and third pixel regions P1, P2, and P3.

The first, second, and third pixel regions P1, P2, and P3 may be arranged alternately in a direction.

The pixel region P may include a light emitting diode OD, and driving elements to drive the light emitting diode OD, and the driving elements may include a plurality of transistors Ts and Td and a storage capacitor Cst.

A circuit configuration of the pixel region P is explained further with reference to FIG. 2.

In each pixel region P of the OLED 10 of this embodiment, the plurality of transistors, for example, a switching transistor Ts and a driving transistor Td, the storage capacitor Cst, and the light emitting diode OD may be formed.

The switching transistor Ts may be connected to a gate line GL and a data line DL, which cross each other to define the pixel region P. A gate electrode of the switching transistor Ts may be connected to the gate line GL, a source electrode of the switching transistor Ts may be connected to the data line DL.

The driving transistor Td may be electrically connected to the switching transistor Ts. For example, a gate electrode of the driving transistor Td may be connected to a drain electrode of the switching transistor Ts.

The driving transistor Td may be connected to the light emitting diode OD. For example, a source electrode of the driving transistor Td may be connected to a first electrode as an anode of the light emitting diode OD.

A drain electrode of the driving transistor Td may be electrically connected to a driving voltage line VDL and be supplied with a first driving voltage VDD. For example, the drain electrode of the driving transistor Td may be connected to the driving voltage line VDL which transfers the first driving voltage VDD as a high potential driving voltage.

The light emitting diode OD may be configured such that a second electrode as a cathode thereof is supplied with a second driving voltage VSS as a low potential driving voltage.

The storage capacitor Cst may be connected between the gate electrode and the source electrode of the driving transistor Td.

For example, a first storage electrode as an electrode of the storage capacitor Cst may be connected to the gate electrode of the driving transistor Td. A second storage electrode as the other electrode of the storage capacitor Cst may be connected to the source electrode of the driving transistor Td.

Regarding the pixel region P configured above, when a gate signal of a turn-on level is applied to the gate line GL, the switching transistor Ts is turned on, and a data signal which is transferred through the data line DL is applied to the gate electrode of the driving transistor Td. Accordingly, the driving transistor Td is turned on, and a driving current, a magnitude of which corresponds to a magnitude of the data signal, is applied to the light emitting diode OD through a channel of the driving transistor Td. Accordingly, a light, which has a brightness corresponding to the applied driving current, is produced from the light emitting diode OD.

A voltage between the gate electrode and the source electrode of the driving transistor Td may be stored in the storage capacitor Cst, and the stored voltage may be maintained until a next frame.

The circuit configuration of the pixel region P shown in FIG. 2 is by way of example. Alternatively, at least one transistor other than the switching transistor Ts and the driving transistor Td may be added in the pixel region P.

The storage capacitor Cst of this embodiment may be formed with the first electrode of the light emitting diode OD and a reflection electrode below the first electrode. Accordingly, a desired storage capacitance can be obtained effectively.

A structure of the OLED 10 which can secure a capacitance of the storage capacitor Cst is explained in detail below.

Figure 3:
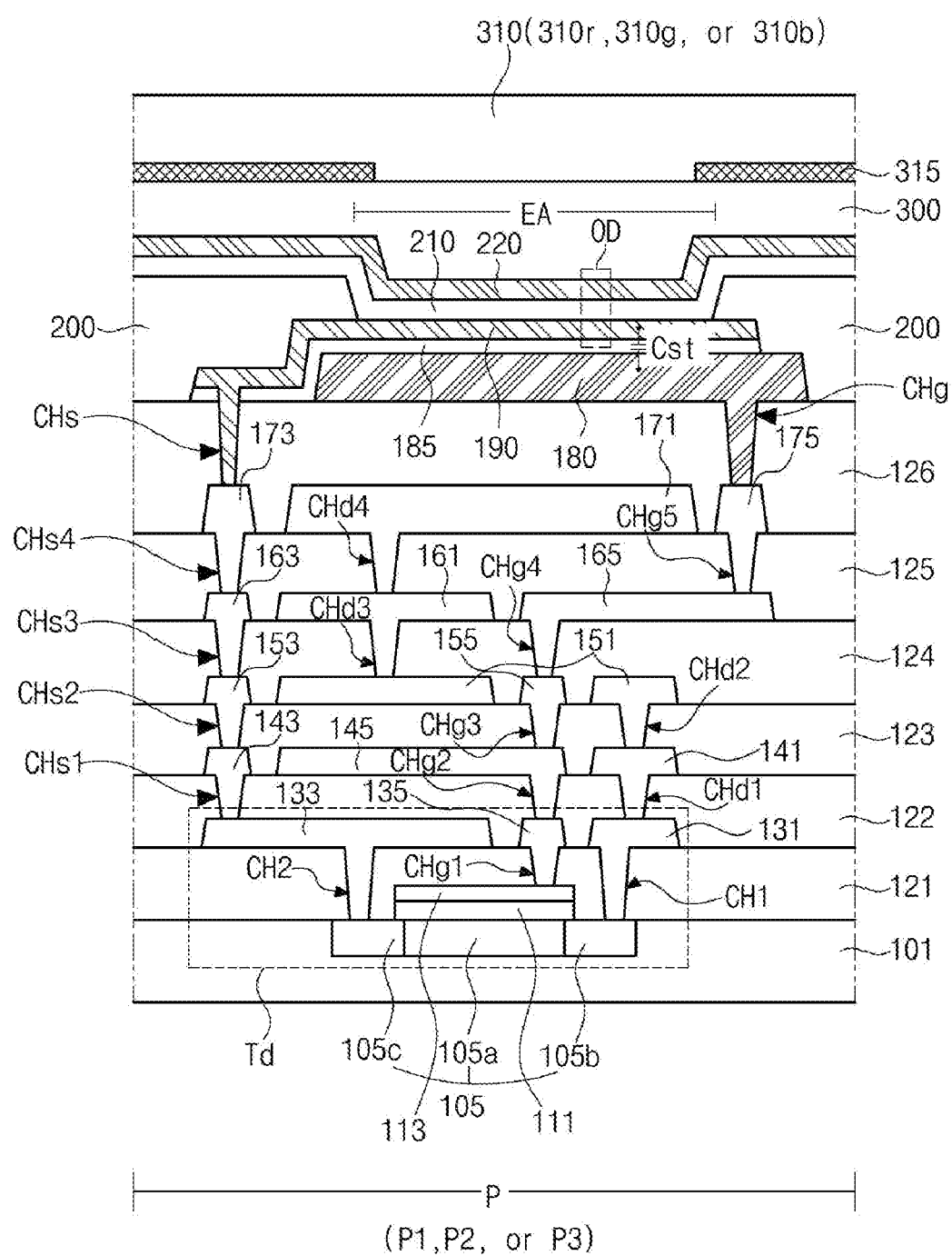
FIG. 3 is a cross-sectional view schematically illustrating an OLED according to the first embodiment of the present disclosure.

FIG. 3 is a cross-sectional view schematically illustrating an OLED according to the first embodiment of the present disclosure.

Referring to FIGS. 1 to 3, the OLED 10 may be a top emission type display device. In other words, the OLED 10 may be configured such that a light is emitted upward from the substrate 101.

The substrate 101 may be, but not limited to, a silicon substrate.

Alternatively, the substrate 101 may be a glass substrate or plastic substrate. In this embodiment, a silicon substrate made of crystalline silicon (e.g., single crystalline silicon) serving as a semiconductor is by way of example.

In some embodiments, when the substrate 101 formed of silicon is used, there is an advantage that a small-sized display device requiring a high resolution is achieved effectively. However in other embodiments, other substrates beside silicon may be used to achieve the same technical benefits.

The substrate 101 formed of silicon may be a P (positive) or N (negative) type substrate lightly doped.

At the substrate 101 formed of silicon, an active portion (or active region) which serves as a semiconductor layer corresponding to each transistor is formed in the pixel region P. For example, at a position where the driving transistor Td is formed, an active portion 105 of the driving transistor Td may be formed.

The active portion 105 may include a channel region 105$a$, and drain and source regions 105$b$ and 105$c$ at both sides of the channel region 105$a$. The drain and source regions 105$b$ and 105$c$ may be formed as N or P type highly doped region.

On the substrate 101 having the active portion 105, a gate insulating layer 111 made of an insulating material may be formed. The gate insulating layer 111 may correspond to the channel region 105$a$.

A first metal layer made of a first metal material may be formed on the gate insulating layer 111. For example, the first metal layer may include a gate electrode 113 which is located on the gate insulating layer 111 corresponding to the channel region 105$a$.

The first metal layer may include the gate line GL connected to the switching transistor Ts.

On the first metal layer including the gate electrode 113, a first passivation layer 121 as an insulating layer made of an insulating material may be formed entirely over the substrate 101. However, in other embodiments, a first passivation layer 121 as an insulating layer made of an insulating material may be formed to at least partially cover the substrate 101.

In the first passivation layer 121, first and second semiconductor contact holes CH1 and CH2 respectively exposing the drain and source regions 105$b$ and 105$c$ of the active portion 105 may be formed. The first and second semiconductor contact holes CH1 and CH2 may be located at both sides of the gate electrode 113, and be spaced apart from the gate electrode 113.

A first gate connection contact hole CHg1 which is a contact hole exposing the gate electrode 113 may be formed in the first passivation layer 121.

A second metal layer made of a second metal material may be formed on the first passivation layer 121. For example, the second metal layer may include a drain electrode 131 and a source electrode 133. The drain and source electrodes 131 and 133 may contact the drain and source regions 105*b* and 105*c* through the first and second semiconductor contact holes CH1 and CH2, respectively.

The second metal layer may include a first gate connection pattern 135. The first gate connection pattern 135 may contact the gate electrode 113 through the first gate connection contact hole CHg1.

On the second metal layer including the drain and source electrodes 131 and 133 and the first gate connection pattern 135, a second passivation layer 122 as an insulating layer made of an insulating material may be formed entirely over the substrate 101. However, in other embodiments, a second passivation layer 122 as an insulating layer made of an insulating material may be formed to at least partially cover the substrate 101.

In the second passivation layer 122, a first drain connection contact hole CHd1 and a first source connection contact hole CHs1 which respectively expose the drain electrode 131 and the source electrode 133 may be formed.

A second gate connection contact hole CHg2 which is a contact hole exposing the first gate connection pattern 135 may be formed in the second passivation layer 122.

A third metal layer made of a third metal material may be formed on the second passivation layer 122. For example, the third metal layer may include the data line DL connected to the switching transistor Ts.

The third metal layer may include a first drain connection pattern 141, a first source connection pattern 143 and a second gate connection pattern 145.

The first drain connection pattern 141 may contact the drain electrode 131 through the first drain connection contact hole CHd1. The first source connection pattern 143 may contact the source electrode 133 through the first source connection contact hole CHs1.

The second gate connection pattern 145 may contact the first gate connection pattern 135 through the second gate connection contact hole CHg2.

On the third metal layer including the first drain connection pattern 141, the first source connection pattern 143 and the second gate connection pattern 145, a third passivation layer 123 as an insulating layer made of an insulating material may be formed entirely over the substrate 101. However, in other embodiments, a third passivation layer 123 as an insulating layer made of an insulating material may be formed to at least partially cover the substrate 101.

In the third passivation layer 123, a second drain connection contact hole CHd2 and a second source connection contact hole CHs2 which respectively expose the first drain connection pattern 141 and the first source connection pattern 143 may be formed.

A third gate connection contact hole CHg3 which is a contact hole exposing the second gate connection pattern 145 may be formed in the third passivation layer 123.

A fourth metal layer made of a fourth metal material may be formed on the third passivation layer 123. For example, the fourth metal layer may include a second drain connection pattern 151, a second source connection pattern 153 and a third gate connection pattern 155.

The second drain connection pattern 151 may contact the first drain connection pattern 141 through the second drain connection contact hole CHd2. The second source connection pattern 153 may contact the first source connection pattern 143 through the second source connection contact hole CHs2.

The third gate connection pattern 155 may contact the second gate connection pattern 145 through the third gate connection contact hole CHg3.

On the fourth metal layer including the second drain connection pattern 151, the second source connection pattern 153 and the third gate connection pattern 155, a fourth passivation layer 124 as an insulating layer made of an insulating material may be formed entirely over the substrate 101. However, in other embodiments, a fourth passivation layer 124 as an insulating layer made of an insulating material may be formed to at least partially cover the substrate 101.

In the fourth passivation layer 124, a third drain connection contact hole CHd3 and a third source connection contact hole CHs3 which respectively expose the second drain connection pattern 151 and the second source connection pattern 153 may be formed.

A fourth gate connection contact hole CHg4 which is a contact hole exposing the third gate connection pattern 155 may be formed in the fourth passivation layer 124.

A fifth metal layer made of a fifth metal material may be formed on the fourth passivation layer 124. For example, the fifth metal layer may include a third drain connection pattern 161, a third source connection pattern 163 and a fourth gate connection pattern 165.

The third drain connection pattern 161 may contact the second drain connection pattern 151 through the third drain connection contact hole CHd3. The third source connection pattern 163 may contact the second source connection pattern 153 through the third source connection contact hole CHs3.

The fourth gate connection pattern 165 may contact the third gate connection pattern 155 through the fourth gate connection contact hole CHg4.

On the fifth metal layer including the third drain connection pattern 161, the third source connection pattern 163 and the fourth gate connection pattern 165, a fifth passivation layer 125 as an insulating layer made of an insulating material may be formed entirely over the substrate 101. However, in other embodiments, a fifth passivation layer 125 as an insulating layer made of an insulating material may be formed to at least partially cover the substrate 101.

In the fifth passivation layer 125, a fourth drain connection contact hole CHd4 and a fourth source connection contact hole CHs4 which respectively expose the third drain connection pattern 161 and the third source connection pattern 163 may be formed.

A fifth gate connection contact hole CHg5 which is a contact hole exposing the fourth gate connection pattern 165 may be formed in the fifth passivation layer 125.

A sixth metal layer made of a sixth metal material may be formed on the fifth passivation layer 125. For example, the sixth metal layer may include a fourth drain connection pattern 171, a fourth source connection pattern 173 and a fifth gate connection pattern 175.

The fourth drain connection pattern 171 may contact the third drain connection pattern 161 through the fourth drain connection contact hole CHd4. The fourth source connection pattern 173 may contact the third source connection pattern 163 through the fourth source connection contact hole CHs4.

The fifth gate connection pattern 175 may contact the fourth gate connection pattern 165 through the fifth gate connection contact hole CHg5.

At the sixth metal layer, the driving voltage line VDL transferring the first driving voltage VDD may be formed. The fourth drain connection pattern 171 may be configured to extend from the driving voltage line VDL.

On the sixth metal layer including the fourth drain connection pattern 171, the fourth source connection pattern 173 and the fifth gate connection pattern 175, a sixth passivation layer 126 (or overcoat layer) as an insulating layer made of an insulating material may be formed entirely over the substrate 101. However, in other embodiments, a sixth passivation layer 126 (or overcoat layer) as an insulating layer made of an insulating material may be formed to at least partially cover the substrate 101.

In the sixth passivation layer 126, a source contact hole CHs and a gate contact hole CHg which respectively expose the fourth source connection pattern 173 and the fifth gate connection pattern 175 may be formed.

The sixth passivation layer 126 may serve as a planarization layer and have a flat (or even) top surface.

As described above, a plurality of metal layers may be laminated below the sixth passivation layer 126 to form electrodes constituting driving elements such as transistors in the pixel region, and signal lines transferring various signals to drive the pixel region such as a data signal, a scan signal including a gate signal) and a power voltage signal including a driving voltage, and, in this embodiment, the first to sixth metal layers being laminated is by way of example. Depending on required types of driving elements and signal lines, a number of stacked metal layers may vary.

A reflection electrode 180 may be formed on the sixth passivation layer 126. The reflection electrode 180 may be formed in a patterned form per the pixel region P. In this regard, the pixel electrodes 180 of neighboring pixel regions may be spaced apart from each other and be electrically disconnected.

A metal material, having reflective property, of the reflection electrode 180 may be, for example, but not limited to, Al, Ag, Ti or APC (Al—Pd—Cu).

The reflection electrode 180 may serve to reflect upward a light which is produced from the light emitting diode OD and travels downward.

Further, the reflection electrode 180 may serve as a first storage electrode as one storage electrode of the storage capacitor Cst.

In this regard, the reflection electrode 180 may contact the fifth gate connection pattern 175 through the gate contact hole CHg.

Accordingly, the reflection electrode 180 may be electrically connected to the gate electrode 113 of the driving transistor Td located therebelow and thus serve as the first storage electrode of the storage capacitor Cst.

A dielectric layer 185 may be formed on the reflection electrode 180. The dielectric layer 185 may be formed of an organic insulating material or inorganic insulating material. The dielectric layer 185 may be formed, for example, but not limited, in a patterned form per the pixel region P.

In the dielectric layer 185 and the sixth passivation layer 126, the source contact hole CHs exposing the fourth source connection pattern 173 may be formed.

The first electrode 190 of the light emitting diode OD may be formed on the dielectric layer 185. The first electrode 190 may be formed in a patterned form per the pixel region P.

The first electrode 190 may be formed of a transparent conductive material such as ITO.

The first electrode 190 may contact the fourth source connection pattern 173 through the source contact hole CHs.

The first electrode 190 may be electrically connected to the source electrode 133 of the driving transistor Td.

The first electrode 190 electrically connected to the source electrode 133 may be located to face the reflection electrode 180 with the dielectric layer 185 therebetween in the pixel region P.

Accordingly, the first electrode 190 may serve as a second storage electrode as the other electrode of the storage capacitor Cst which is connected to the source electrode 133 of the driving transistor Td.

A bank 200 (or partition wall) may be formed on the first electrode 190 and surround the pixel region P along a boundary of the pixel region P.

The bank 200 may include an opening exposing the first electrode 190 of the pixel region P, and cover an edge of the first electrode 190. By the opening of the bank 200, an emission region EA where a light is substantially produced in the pixel region P may be defined.

An edge of the reflection electrode 180 may extend below the bank 200.

An organic light emitting layer 210 may be formed on the first electrode 190 exposed through the opening of the bank 200. The organic light emitting layer 210 may be configured with a multi-layered structure which includes an emitting material layer.

The organic light emitting layer 210 may be formed per the pixel region P. Alternatively, the organic light emitting layer 210 may be continuously formed to be entirely over the display region and correspond to all pixel regions P. In this embodiment, the organic light emitting layer 210 being formed entirely over the display region is by way of example, and in this case, the organic light emitting layer 210 may be formed to extend along the first electrode 190 and the bank 200. However, other arrangements of the organic light emitting layer 210 may be contemplated. For example, the organic light emitting layer 210 may be continuously formed to be at least partially cover the display region.

The organic light emitting layer 210 may be a white organic light emitting layer 210 emitting a white. Since the organic light emitting layer 210 may be formed continuously over all pixel regions P, the organic light emitting layers 210 located in the first to third pixel regions P1 to P3 display different colors may emit the same white light.

Alternatively, the organic light emitting layer 210 may be formed per the pixel region P. In this case, the organic light emitting layers 210 located in the first to third pixel regions P1 to P3 display different colors may emit the color lights of the respective pixel regions P1 to P3.

The second electrode 220 may be formed on the organic light emitting layer 210. In some embodiments, the second electrode 220 may be formed entirely over the substrate 101.

The second electrode 220 may be a transparent electrode having a transparent property, and in this case, the second electrode 220 may be formed of a transparent conductive material such as ITO.

An encapsulation layer 300 to encapsulate the substrate 101 having the second electrode 220 may be formed on the second electrode 220. In some embodiments, the encapsulation layer 300 may be formed entirely over the substrate 101. The encapsulation layer 300 may prevent penetration of external moisture and oxygen and improve a reliability.

Further, the encapsulation layer 300 may planarize the substrate 101 having the second electrode 220.

The encapsulation layer 300 may be formed with a single-layered or multi-layered structure using at least one of an inorganic insulating material and an organic insulating material.

A color filter layer 310 may be formed on the encapsulation layer 300. The color filter layer 310 may function to produce a color light of each pixel region P.

In this regard, the color filter layer 310 may include first, second and third color filter patterns 310r, 310g and 310b which respectively correspond to the first, second and third pixel regions P1, P2 and P3 to produce red, green and blue colors of the first, second and third pixel regions P1, P2 and P3.

Accordingly, a white light from the light emitting diode OD emitting the white light passes through the color filter patterns 310r, 310g and 310b to output red, green and blue light.

A black matrix 315 may be formed on the encapsulation layer 300. The black matrix 315 may be located along the boundary of the pixel region P and between neighboring color filter patterns.

In the above-described embodiment, in the top emission type OLED 10, the storage capacitor Cst may be formed over an array lamination structure driving the light emitting diode OD and below the light emitting diode OD, and the array lamination structure may include driving elements and lines and patterns to transfer signals. In this case, the reflection electrode 180 may be used as one electrode of the storage capacitor Cst, and the first electrode 190 of the light emitting diode OD may be used as the other electrode of the storage capacitor Cst.

As such, by disposing the storage capacitor Cst over the array lamination structure, the storage capacitor Cst is not restricted to an area or design of the array lamination structure, and thus the storage capacitor Cst can be formed to have as large an area as possible. Accordingly, a capacitance of the storage capacitor Cst as required in a high resolution model can be secured sufficiently. Similarly, the array lamination structure is not restricted to an area or design of the storage capacitor Cst, and thus a layout degree of freedom for the array lamination structure can be improved.

Further, since the reflection electrode 180 and the first electrode 190 are used as the storage electrodes, extra electrodes to constitute the storage capacitor Cst is not needed. Accordingly, production processes and cost can be reduced, and production efficiency can be secured.

Second Embodiment

Figure 4:
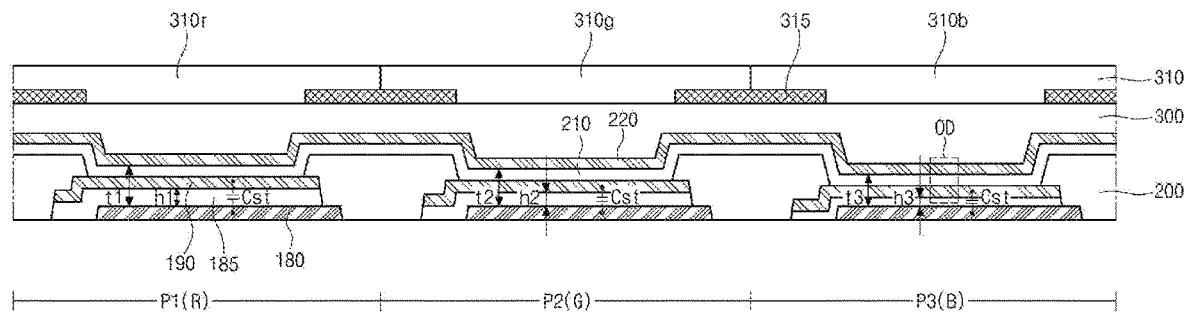
FIG. 4 is a cross-sectional view schematically illustrating an OLED according to a second embodiment of the present disclosure.

FIG. 4 is a cross-sectional view schematically illustrating an OLED according to a second embodiment of the present disclosure.

In FIG. 4, for the purpose of explanations, components of an OLED relevant to this embodiment are shown, and an array lamination structure below the reflection electrode 180 is omitted.

Explanation of parts similar to parts of the above first embodiment may be omitted.

Referring to FIG. 4, the OLED 10 of this embodiment may include a micro cavity structure. The micro cavity structure achieves a micro cavity effect which improves a color purity and a light efficiency by a constructive interference of light.

To configure the micro cavity structure, the second electrode 220 may include a semi-transparent (or semi-reflective) electrode layer having a semi-transparent (or semi-reflective) property.

Accordingly, in each pixel region, a light reflected and constructively interfered between the reflection electrode 180 and the second electrode 220 located below and on the organic light emitting layer 210 may pass through the second electrode 220 having a semi-transparent property and be output upward.

Since the first to third pixel regions P1 to P3 output lights of different colors e.g., different wavelengths, the first to third pixel regions P1 to P3 have different cavity thicknesses. The cavity thickness is a distance between the reflection electrode 180 and the second electrode 220.

In this regard, the first, second and third pixel regions P1, P2 and P3 respectively displaying red, green and blue may have cavity thicknesses proportional to respective color wavelengths (or respective color half-wavelengths). A cavity thickness of each pixel region P may match an integer multiple of half-wavelength of its color.

In this regard, the first pixel region P1 of a red which has the longest wavelength has a first cavity thickness t1, the second pixel region P2 of a green which has the middle wavelength has a second cavity thickness t2 less than the first cavity thickness t1, and the third pixel region P3 of a blue which has the shortest wavelength has a third cavity thickness t3 less than the second cavity thickness t2.

In this embodiment, in setting different cavity thicknesses among the first to third pixel regions P1 to P3, a height (or thickness) of the dielectric layer 185 may be different among the first to third pixel regions P1 to P3. In other words, each of the reflection electrode 180, the first electrode 190 and the organic light emitting layer 210 may be formed at the same or substantially the same thickness among the pixel regions, and thus the height of the dielectric layer 185 may be made different among the pixel regions.

For example, the dielectric layer 185 of the first pixel region P1 of a red may have a first height h1 which is highest, the dielectric layer 185 of the second pixel region P2 of a green may have a second height h2 less than the first height h1, and the dielectric layer 185 of the third pixel region P3 of a blue may have a third height h3 less than the second height h2.

As such, by making the height of the dielectric layer 185 different among the pixel regions P1, P2 and P3 of different colors, the different cavity thicknesses required for the pixel regions P1, P2 and P3 can be realized.

In this embodiment, by a different structure of the height of the dielectric layer 185, the micro cavity structure can be achieved. Accordingly, the pixel regions P1, P2 and P3 of different colors can have the same or substantially the same thickness of the light emitting diode OD, and thus the pixel regions P1, P2 and P3 can have the same or substantially the same property of the light emitting diode OD.

Further, the first to third pixel regions P1 to P3 can use the same white organic light emitting layer 210, and each pixel region P can convert a white light into its color light through its micro cavity structure, and output the color light.

Further, to increase a color purity, each pixel region P may include the corresponding color filter pattern 310r, 310g or 310b which is located on the light emitting diode OD.

Third Embodiment

Figure 5:
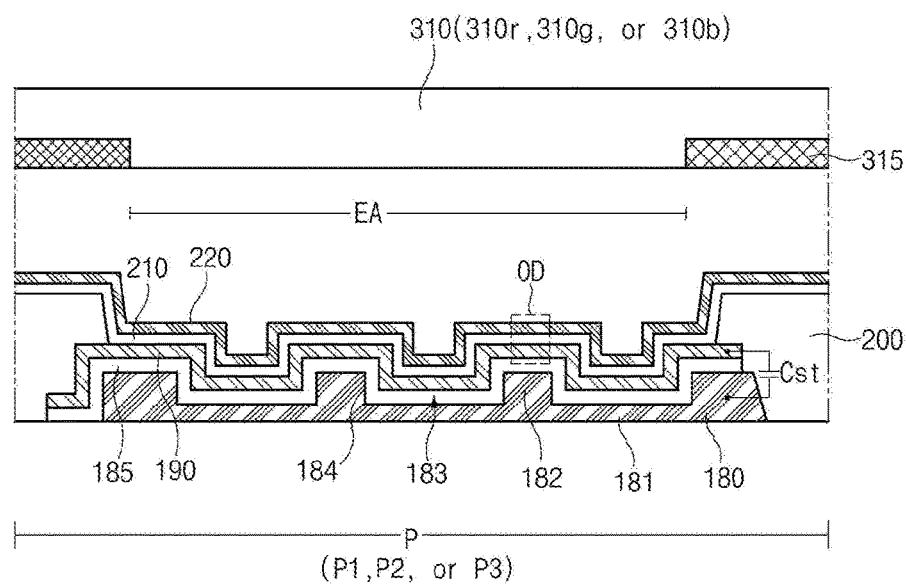
FIG. 5 is a cross-sectional view schematically illustrating an OLED according to a third embodiment of the present disclosure.
Figure 6:
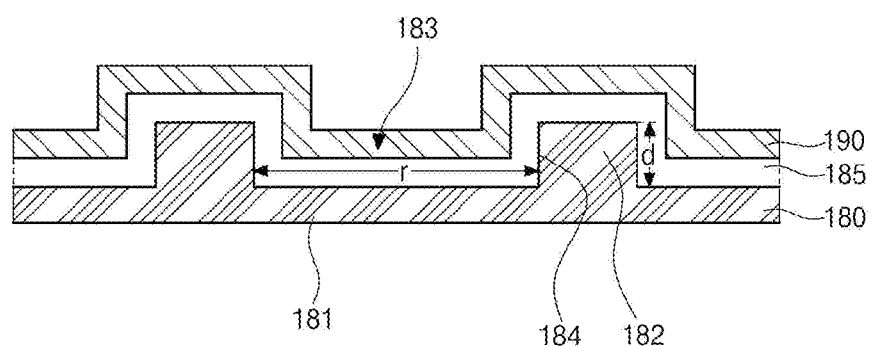
FIG. 6 is a cross-sectional view enlarging a storage capacitor of FIG. 5.
Figure 7:
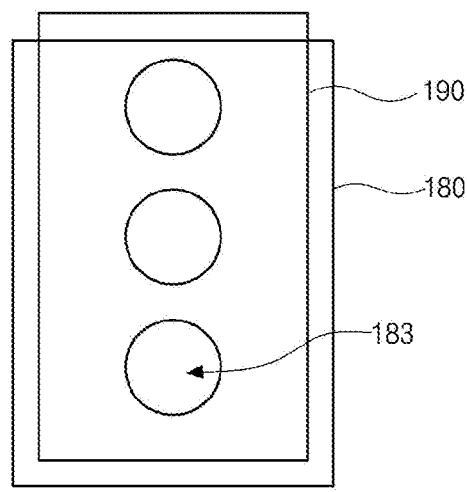
FIG. 7 is a plan view schematically illustrating a reflection electrode and a first electrode forming a storage capacitor according to a third embodiment of the present disclosure.

FIG. 5 is a cross-sectional view schematically illustrating an OLED according to a third embodiment of the present disclosure. FIG. 6 is a cross-sectional view enlarging a storage capacitor of FIG. 5. FIG. 7 is a plan view schematically illustrating a reflection electrode and a first electrode forming a storage capacitor according to a third embodiment of the present disclosure.

In FIG. 5, for the purpose of explanations, components of an OLED relevant to this embodiment are shown, and an array lamination structure below the reflection electrode 180 is omitted.

Explanation of parts similar to parts of the above first and second embodiments may be omitted.

Referring to FIGS. 5 to 7, in the OLED 10 of this embodiment, the storage capacitor Cst may have an uneven structure.

The OLED 10 of this embodiment may have the same or like components of the OLED of the first embodiment, except for the storage capacitor Cst having the uneven structure.

As shown in FIG. 5, the storage capacitor Cst has a first plate and a second plate and the dielectric layer 185 between the first and second plates. Namely, the first plate is implemented through the first electrode 190 and the second plate is implemented through the reflection electrode 180. The storage capacitor Cst has an uneven shape or structure in that the cross-sections show a square-like wave. For example, the first electrode 190 is not planar in the emission area EA and includes furrows or recesses. The dielectric layer 185 also has a square-like wave cross-section in the emission area EA. The reflection electrode 180 has furrows 183 and protruded portions 182 in the emission area EA.

Since the storage capacitor Cst has the uneven structure, the reflection electrode 180 and the first electrode 190 as storage electrodes of the storage capacitor Cst increase in surface area.

In this regard, in the above first embodiment, the storage electrode in the pixel region P has an entirely same or substantially the same thickness and is formed substantially flat over the substrate. Compared with the structure of the first embodiment, in the uneven structure of the reflection electrode 180 and the first electrode 190 of this embodiment, a surface area increases by an area of side portions which are not flat with a surface of the substrate. By the increase of the surface are, a capacitance of the storage capacitor Cst can increase. Accordingly, a capacitance of the storage capacitor Cst required can be secured more efficiently.

Regarding the uneven structure of this embodiment, the reflection electrode 180 as the lower storage electrode may have a surface e.g., a top surface of an uneven shape, and to do this, the reflection electrode 180 may have a plurality of furrows 183 which are spaced apart from each other along a direction.

In this regard, in the reflection electrode 180, a plurality of protrusion portions 182, which protrude upward, and a plurality of dent portions 181, which are dented downward, may be arranged alternately along a direction, and thus the plurality of furrows 183 are recess spaces on the dent portions 181. Accordingly, in the reflection electrode 180, the protrusion portions 182 and the furrows 183 may be arranged alternately along a direction.

The furrow 183 may be formed to have a width r and a height d. In this regard, each of the width r and the height d of the furrow 183 may be in a range of nanometers. For example, the width r of the furrow 183 may be, but not limited to, about 250 nm to about 350 nm, and the height d of the furrow 183 may be, but not limited to, about 30 nm to about 70 nm.

The furrow 183 may have a circular shape in a plan view, as shown in FIG. 7. Alternatively, the furrow 183 may have a polygonal shape in a plan view.

As the reflection electrode 180 is formed to have the uneven shape, the dielectric layer 185 and the first electrode 190, which are laminated over the reflection electrode 180, may have the uneven shape along the top surface of the reflection electrode 180, or may be formed according to the uneven shape of the top surface of the reflection electrode 180.

As such, since the reflection electrode 180 and the first electrode 190 constituting the storage capacitor Cst are formed to have an uneven shape in a cross-sectional view, the storage capacitor Cst can be produced at side-surface portions of the furrows 183. In this regard, the storage capacitor Cst may be produced between a side surface 184 of the protrusion portion 182 of the reflection electrode 180 and a corresponding side surface of the first electrode 190.

As above, by the uneven structure, surface areas of the storage electrodes can increase by the side-surface portions of the furrows 183, and a capacitance of the storage capacitor Cst can increase.

As the storage capacitor Cst has the uneven structure, the organic light emitting layer 210 and the second electrode 220, which are located on the first electrode 190, may have the uneven structure, that is, the organic light emitting layer 210 and the second electrode 220 may be formed according to the uneven shape of the first electrode 190.

As such, by the uneven structure of the storage capacitor Cst, the light emitting diode OD located on the storage capacitor Cst may naturally include a lens array structure that protrusion portions and dent portions are repeated. In this regard, as described above, the furrow 183 may be formed at a size of nanometers, and thus the light emitting diode OD may have a lens array structure with a lens size of nanometers e.g., a nanolens array structure.

As the light emitting diode OD has the nanolens array structure, an efficiency of outputting a light, which is wave-guided in a lateral direction in the light emitting diode OD, to the outside can be improved. In other words, on a principle similar to that of a microlens array structure, a path of a light wave-guided in a later direction is changed by the nanolens array structure, thus an incidence angle is reduced, and thus an output of the light wave-guided can increase.

Further, in the nanolens array structure, a visible light which has a relatively short wavelength may be diffracted. Accordingly, a path of a light wave-guided in a lateral direction is changed outside the light emitting diode OD by a diffraction, and a light output efficiency can further increase. In this regard, since a microlens array structure has a lens size of micrometers, a diffraction of a visible light hardly happens. However, by the nanolens array structure of this embodiment, a light output efficiency can further increase.

Fourth Embodiment

Figure 8:
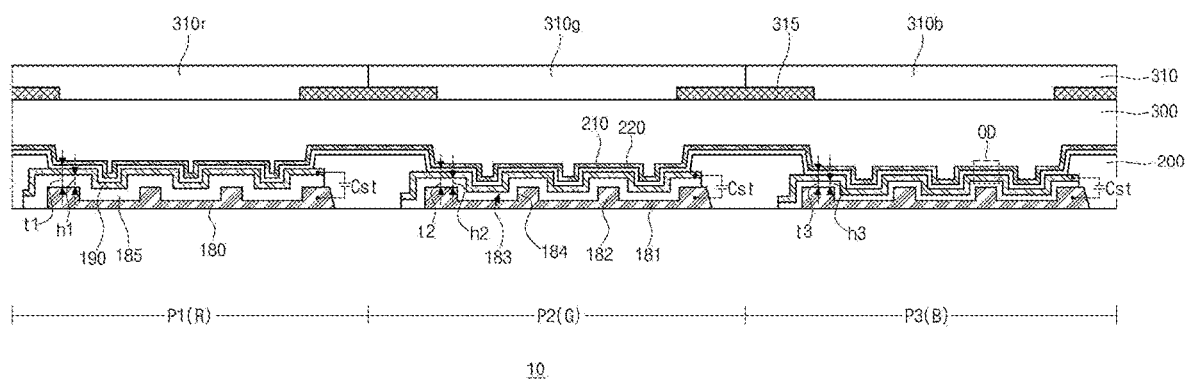
FIG. 8 is a cross-sectional view schematically illustrating an OLED according to a fourth embodiment of the present disclosure.

FIG. 8 is a cross-sectional view schematically illustrating an OLED according to a fourth embodiment of the present disclosure.

In FIG. 8, for the purpose of explanations, components of an OLED relevant to this embodiment are shown, and an array lamination structure below the reflection electrode 180 is omitted.

Explanation of parts similar to parts of the above first to third embodiments may be omitted.

Referring to FIG. 8, in the OLED 10 of this embodiment, the storage capacitor Cst may have an uneven structure as in the third embodiment, and the light emitting diode OD may have a micro cavity structure as in the second embodiment.

To configure the micro cavity structure, the second electrode 220 located on the organic light emitting layer 210 may include a semi-transparent (or semi-reflective) electrode layer having a semi-transparent (or semi-reflective) property.

Accordingly, in each pixel region, a light reflected and constructively interfered between the reflection electrode 180 and the second electrode 220 located below and on the organic light emitting layer 210 may pass through the second electrode 220 having a semi-transparent property and be output upward.

Since the first to third pixel regions P1 to P3 output lights of different colors e.g., different wavelengths, the first to third pixel regions P1 to P3 have different cavity thicknesses.

In this regard, the first, second and third pixel regions P1, P2 and P3 respectively displaying red, green and blue may have cavity thicknesses proportional to respective color wavelengths (or respective color half-wavelengths). For example, the first pixel region P1 of a red which has the longest wavelength has a first cavity thickness t1, the second pixel region P2 of a green which has the middle wavelength has a second cavity thickness t2 less than the first cavity thickness t1, and the third pixel region P3 of a blue which has the shortest wavelength has a third cavity thickness t3 less than the second cavity thickness t2.

In this embodiment, in setting different cavity thicknesses among the first to third pixel regions P1 to P3, a height (or thickness) of the dielectric layer 185 may be different among the first to third pixel regions P1 to P3. In other words, each of the reflection electrode 180, the first electrode 190 and the organic light emitting layer 210 may be formed at the same thickness among the pixel regions, and thus the height of the dielectric layer 185 may be made different among the pixel regions.

For example, the dielectric layer 185 of the first pixel region P1 of a red may have a first height h1 which is highest, the dielectric layer 185 of the second pixel region P2 of a green may have a second height h2 less than the first height h1, and the dielectric layer 185 of the third pixel region P3 of a blue may have a third height h3 less than the second height h2.

As such, by making the height of the dielectric layer 185 different among the pixel regions P1, P2 and P3 of different colors, the different cavity thicknesses required for the pixel regions P1, P2 and P3 can be realized.

In this embodiment, by a different structure of the height of the dielectric layer 185, the micro cavity structure can be achieved. Accordingly, the pixel regions P1, P2 and P3 of different colors can have the same or substantially the same thickness of the light emitting diode OD, and thus the pixel regions P1, P2 and P3 can have the same or substantially the same property of the light emitting diode OD.

Further, the first to third pixel regions P1 to P3 can use the same white organic light emitting layer 210, and each pixel region P can convert a white light into its color light through its micro cavity structure, and output the color light.

Further, to increase a color purity, each pixel region P may include the corresponding color filter pattern 310r, 310g or 310b which is located on the light emitting diode OD.

In the above-described embodiments, the storage capacitor Cst may be formed over the array lamination structure driving the light emitting diode in which driving elements and lines and patterns to transfer signals are formed, and the reflection electrode and the first electrode of the light emitting diode may be used as storage electrodes.

Accordingly, the storage capacitor is not restricted to an area or design of the array lamination structure below the storage capacitor and the storage capacitor can be formed to have as large an area as possible, and thus a required storage capacitance can be secured sufficiently. Similarly, the array lamination structure is not restricted to an area or design of the storage capacitor over the array lamination structure, and thus a layout degree of freedom for the array lamination structure can be improved.

Further, since the reflection electrode and the first electrode are used as the storage electrodes, extra storage electrodes is not needed, and thus production processes and cost can be reduced, and production efficiency can be secured.

Further, when the storage capacitor is formed to have an uneven pattern, the storage capacitance can be maximized. In this case, since the light emitting diode has a nanolens array structure, a light output efficiency can increase.

It will be apparent to those skilled in the art that various modifications and variations can be made in a display device of the present disclosure without departing from the sprit or scope of the disclosure. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display device, comprising:
a substrate;
a plurality of pixels on the substrate;
a driving transistor including a gate electrode, a source electrode, and a drain electrode;
a reflection electrode on the driving transistor, the reflection electrode electrically connected to the gate electrode of the driving transistor;
a dielectric layer on the reflection electrode;
a first electrode on the dielectric layer and facing the reflection electrode, the first electrode electrically connected to the source electrode of the driving transistor;
an organic light emitting layer on the first electrode; and
a second electrode on the organic light emitting layer,
wherein each of the plurality of pixels includes first, second and third pixel regions displaying first, second and third colors, respectively, wherein the first, second, and third colors are different from each other,
wherein the first color has a wavelength longer than that of the second color, and the second color has a wavelength longer than that of the third color, and
wherein the dielectric layer of the first pixel region has a thickness greater than that of the dielectric layer of the second pixel region, and the dielectric layer of the second pixel region has a thickness greater than that of the dielectric layer of the third pixel region.

2. The device of claim 1, wherein each of the reflection electrode, the dielectric layer, and the first electrode has a non-planar top surface.

3. The device of claim 2, wherein the reflection electrode includes a plurality of furrows, and wherein the dielectric layer and the first electrode have a shape corresponding to the plurality of furrows of the reflection electrode.

4. The device of claim 3, wherein the reflection electrode includes a plurality of protrusion portions and a plurality of dent portions,
wherein the plurality of dent portions are below the plurality of furrows, respectively, and
wherein a thickness of each of the plurality of protrusion portions is greater than a thickness of each of the plurality of dent portions.

5. The device of claim 2, wherein each of the organic light emitting layer and the second electrode has a non-planar top surface corresponding to the non-planar top surface of the first electrode.

6. The device of claim 2, wherein the reflection electrode includes a plurality of furrows thereby having the non-planar top surface, and
wherein the dielectric layer and the first electrode are formed according to the non-planar top surface of the reflection electrode.

7. The device of claim 1, wherein in each of the first to third pixel regions, a thickness which is a distance from the reflection electrode to the second electrode matches an integer multiple of a half-wavelength of a color of each of the first to third pixel regions.

8. The device of claim 1, wherein the organic light emitting layer of each of the plurality of pixel region emits a white light, and
wherein a color filter pattern corresponding to a color of each of the plurality of pixel region is on the second electrode.

9. The device of claim 1, wherein the substrate is a crystalline silicon substrate,
wherein a plurality of metal layers are formed between the substrate and the reflection electrode, and
wherein the plurality of metal layers includes:
a first metal layer including the gate electrode of the driving transistor;
a second metal layer which is on the first metal layer, and includes the drain electrode and the source electrode of the driving transistor; and
at least one metal layer which is on the second metal layer, and includes at least one gate connection pattern to connect the gate electrode with the reflection electrode, at least one source connection pattern to connect the source electrode with the first electrode, and at least one drain connection pattern to connect the drain electrode with a driving voltage line.

10. The device of claim 1, wherein a cross-section of the first electrode includes a square-wave like shape.

11. The device of claim 10, wherein a cross-section of the dielectric layer includes a square-wave like shape.

12. The device of claim 1, wherein the first electrode, the organic light emitting layer and the second electrode constitute a light emitting diode, and the reflection electrode, the dielectric layer and the first electrode constitute a storage capacitor.

13. The device of claim 12, wherein the light emitting diode has the same or substantially the same thickness in the plurality of pixel regions.

14. The device of claim 1, further comprising a bank formed on the first electrode, wherein the bank includes an opening exposing the first electrode and covers an edge of the first electrode, and an edge of the reflection electrode extends below the bank.

15. An organic light emitting display device, comprising:
a substrate;
a plurality of pixels defined on the substrate;
a driving transistor in each of the plurality of pixels, the driving transistor including a gate electrode, a source electrode, and a drain electrode;
a reflection electrode on the driving transistor, the reflection electrode electrically connected to the gate electrode of the driving transistor;
a dielectric layer on the reflection electrode;
a first electrode on the dielectric layer and facing the reflection electrode, the first electrode electrically connected to the source electrode of the driving transistor;
an organic light emitting layer on the first electrode; and
a second electrode on the organic light emitting layer,
wherein each of the reflection electrode, the dielectric layer, and the first electrode has a non-planar top surface,
wherein the reflection electrode includes a plurality of furrows,
wherein the dielectric layer and the first electrode have a shape corresponding to the plurality of furrows of the reflection electrode, and
wherein the each of the furrows of the reflection electrode has a width of about 250nm to about 350nm, and a height of about 30nm to about 70nm.

16. An organic light emitting display device, comprising:
a substrate;
a plurality of pixels defined on the substrate;
a driving transistor in each of the plurality of pixels, the driving transistor including a gate electrode, a source electrode, and a drain electrode;
a reflection electrode on the driving transistor, the reflection electrode electrically connected to the gate electrode of the driving transistor;
a dielectric layer on the reflection electrode;
a first electrode on the dielectric layer and facing the reflection electrode, the first electrode electrically connected to the source electrode of the driving transistor;
an organic light emitting layer on the first electrode; and
a second electrode on the organic light emitting layer,
wherein each of the reflection electrode, the dielectric layer, and the first electrode has a non-planar top surface,
wherein the reflection electrode includes a plurality of furrows,
wherein the dielectric layer and the first electrode have a shape corresponding to the plurality of furrows of the reflection electrode, and
wherein the plurality of furrows are formed at a size of nanometers.

* * * * *